United States Patent
Lin et al.

(10) Patent No.: US 10,720,694 B2
(45) Date of Patent: Jul. 21, 2020

(54) ANTENNA CARRIER PLATE STRUCTURE

(71) Applicant: Kinsus Interconnect Technology Corp., Taoyuan (TW)

(72) Inventors: Ting-Hao Lin, Taoyuan (TW); Yung-Lin Chia, Taoyuan (TW); Chiao-Cheng Chang, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/175,807

(22) Filed: Oct. 30, 2018

(65) Prior Publication Data
US 2020/0136233 A1 Apr. 30, 2020

(51) Int. Cl.
| | |
|---|---|
| H05K 13/00 | (2006.01) |
| H01Q 1/22 | (2006.01) |
| H05K 1/11 | (2006.01) |
| H05K 1/14 | (2006.01) |
| H01Q 1/52 | (2006.01) |
| H05K 1/18 | (2006.01) |
| H01Q 5/307 | (2015.01) |

(52) U.S. Cl.
CPC ............ *H01Q 1/2283* (2013.01); *H01Q 1/521* (2013.01); *H05K 1/11* (2013.01); *H05K 1/115* (2013.01); *H05K 1/144* (2013.01); *H05K 1/183* (2013.01); *H01Q 5/307* (2015.01); *H05K 2201/041* (2013.01)

(58) Field of Classification Search
CPC ........ H01Q 1/2283; H01Q 1/521; H05K 1/11; H05K 1/115; H05K 1/144; H05K 1/183

USPC .......................................................... 361/764
See application file for complete search history.

(56) References Cited

U.S. PATENT DOCUMENTS 8,093,701 B2 * 1/2012 Nemoto ................ H01L 21/568
257/678
9,893,018 B2 2/2018 Ko et al.

FOREIGN PATENT DOCUMENTS

| TW | I449484 B | 8/2014 |
|---|---|---|
| TW | I548395 B | 9/2016 |
| TW | I585932 B | 6/2017 |
| TW | I591785 B | 7/2017 |

* cited by examiner

*Primary Examiner* — Tremesha S Willis
(74) *Attorney, Agent, or Firm* — Sinorica, LLC

(57) ABSTRACT

An antenna carrier plate structure has a first circuit board and a second circuit board. The first circuit board has a first substrate and a conductive connector disposed in the first substrate. The conductive connector has two opposite connecting ends respectively protruding from two opposite surfaces of the first substrate. The second circuit board has a second substrate formed with a through hole, and a connecting plug is disposed in the through hole. One end of the connecting plug is formed with an engaging concave portion for engaging one end of the conductive connector of the first substrate. Therefore, each circuit board can be firmly fixed and electrically connected by engaging to form a multi-layer circuit board module, thereby avoiding joint tolerances during soldering and ensuring a correct connection of the joints.

10 Claims, 4 Drawing Sheets

ANTENNA CARRIER PLATE STRUCTURE

BACKGROUND OF THE INVENTION

1. Field of the Invention

The present invention relates to an antenna carrier plate, especially an antenna carrier plate structure.

2. Description of the Prior Arts

The communication industry is one of the main research directions in the development of modern science and technology. In recent years, mobile communication has spread all over the world. Most electronic products have wireless communication modules for one or multiple frequency bands. Therefore, the wireless communication industry continuously invests resources on the research and development to integrate the wireless communication modules of different frequency bands into one product to efficiently utilize the inner space of the product and avoid interference between the wireless communication module and other modules in the product.

The wireless communication module mainly includes at least one antenna unit and a processing unit. In general, the length, width, and material of the antenna unit are determined by the frequency of the wireless signal transmitted or received by the antenna unit, so as to receive the wireless signal of the specific frequency band. The conventional antenna is a metal wire of a required length, width, and thickness formed on an antenna carrier plate by circuit printing processes to form the antenna unit. The antenna carrier plate is soldered to a printed circuit board and the processing unit is also soldered to the printed circuit board. Thus, the antenna carrier plate can be electrically connected to the processing unit to form the wireless communication module with communication function through the printed circuit board.

Furthermore, for good communication efficiency, while avoiding the interference with other circuit components or modules in the electronic device, the layout of the antenna unit is limited by design specifications. In particular, when multiple antenna units of different frequency bands are integrated in a wireless communication module to receive or transmit wireless signals in different frequency bands, the multiple antenna units must be soldered to the printed circuit board and connected to the processing unit through circuits formed on the printed circuit board.

However, when multiple antenna units are respectively soldered to the printed circuit board, limited by the soldering technology, joint tolerances are produced. Therefore, the more antenna units are soldered, the larger the joint tolerance is and the higher the probability of poor contact is. A yield rate of the wireless communication module will be reduced. Thus, the conventional wireless communication modules need to be improved.

To overcome the shortcomings, the present invention provides an antenna carrier plate structure to mitigate or obviate the aforementioned problems.

SUMMARY OF THE INVENTION

In view of the shortcomings that the design of an antenna unit in a conventional circuit board antenna module is difficult to multi-element application due to limitation of circuit board manufacturing and antenna design specifications, the present invention provides an antenna carrier plate structure comprising a first circuit board and a second circuit board.

The first circuit board includes a first substrate and a conductive connector, and the first substrate has a first surface and a second surface opposite to each other. The conductive connector has a first connecting end and a second connecting end. The conductive connector is disposed through the first substrate. The first connecting end protrudes from the first surface and the second connecting end protrudes from the second surface.

The second circuit board includes a second substrate and a connecting plug. The second substrate has a first surface and a second surface opposite to each other. The first surface of the second substrate faces toward the first surface of the first substrate. The second substrate is formed with a through hole. The through hole is disposed from the first surface of the second substrate to the second surface of the second substrate. The connecting plug is arranged in the through hole. One end of the connecting plug, facing the first substrate, is formed with an engaging concave portion. The engaging concave portion is engaged with the first connecting end of the conductive connector.

In the process of connecting the first circuit board and the second circuit board, as long as the second circuit board and the first circuit board respectively reach a corresponding connection position, the connecting end of the conductive connector of the first circuit board is correspondingly held in the engaging concave portion of the second circuit board. At this time, by a pressing step, the connecting end and the engaging concave portion can be tightly fixed. Therefore, the first circuit board and the second circuit board can be connected to form a multi-layer circuit board module in a fast and stable way.

The first circuit board and the second circuit board can be firmly fixed and electrically connected without soldering, thereby avoiding joint tolerances during soldering. The correspondence between the first connecting end of each connector and the engaging concave portion of the connecting plug enables the first circuit board and the second circuit board to automatically align, thereby ensuring that each contact is securely and accurately connected without connection errors or poor contact.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
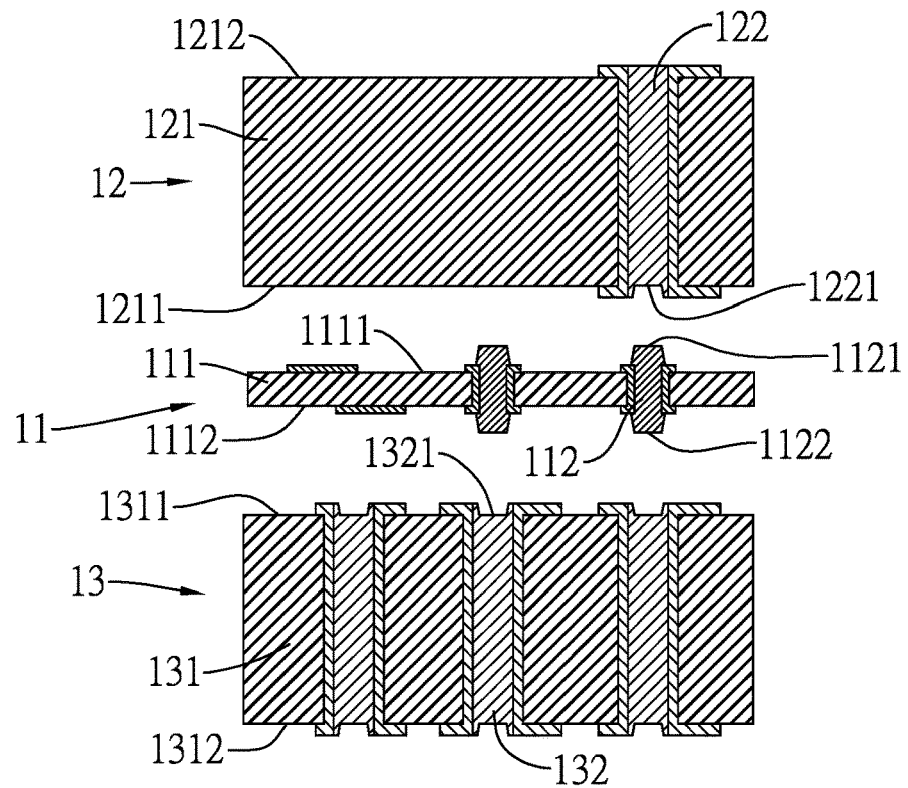
FIG. 1 is an exploded cross-sectional view of an antenna carrier plate structure of a first embodiment the present invention.

With reference to FIG. 1, an antenna carrier plate structure comprises a first circuit board 11 and a second circuit board 12. The first circuit board 11 includes a first substrate 111 and a conductive connector 112. The first substrate 111 has a first surface 1111 and a second surface 1112 opposite to each other. The conductive connector 112 is disposed through the first surface 1111 and the second surface 1112 of the first substrate 111 and has a first connecting end 1121 and a second connecting end 1122 opposite to each other. The first connecting end 1121 and the second connecting end 1122 respectively protrude from the first surface 1111 and the second surface 1112 of the first substrate 111.

The second circuit board 12 is disposed on the first surface 1111 of the first substrate 111 and includes a second substrate 121 and a connecting plug 122. The second substrate 121 has a first surface 1211 and a second surface 1212 opposite to each other. The first surface 1211 of the second substrate 121 is mounted toward the first surface 1111 of the first substrate 111. The second substrate 121 is formed with a through hole. The through hole is disposed from the first surface 1211 of the second substrate 121 to the second surface 1212 of the second substrate 121 and is disposed corresponding to the conductive connector 112 of the first substrate 111. The connecting plug 122 is formed in the through hole of the second substrate 121. One end of the connecting plug 122, facing the first surface 1211 of the second substrate 121, is formed with an engaging concave portion 1221. The engaging concave portion 1221 is engaged with the first connecting end 1121 of the conductive connector 112 of the first substrate 111.

Figure 2:
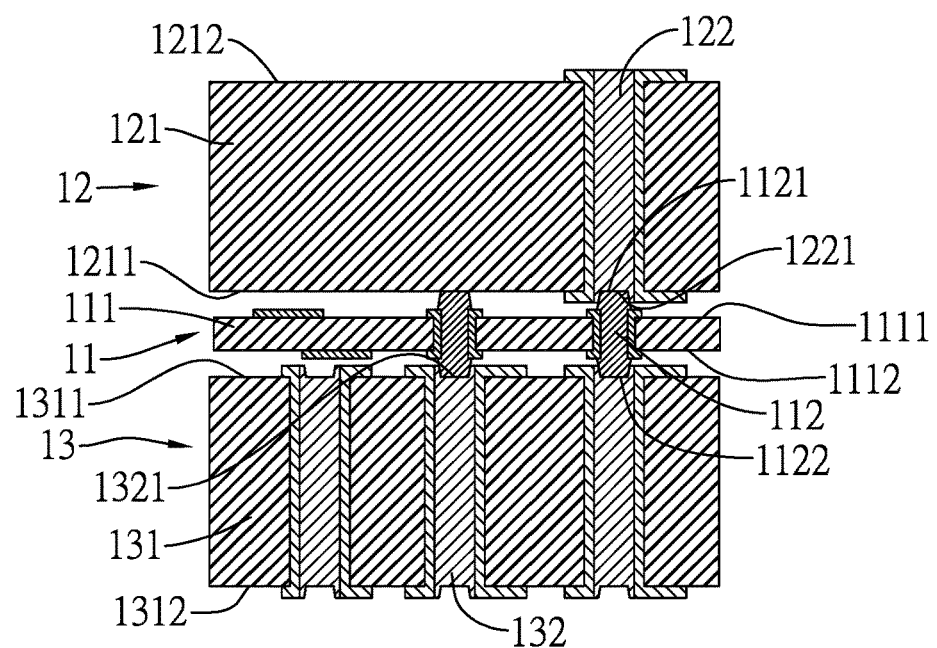
FIG. 2 is a cross-sectional view of an antenna carrier plate structure of the present invention.

With reference to FIG. 2, when the conductive connector 112 of the first circuit board 11 is engaged in the engaging concave portion 1221 of the connecting plug 122 of the second circuit board 12, the second circuit board 12 and the first circuit board 11 can be fixed and electrically connected by engaging. In this way, the first circuit board 11 and the second circuit board 12 can be firmly fixed and electrically connected without soldering, thereby avoiding joint tolerances during soldering. The correspondence between the first connecting end 1121 of the conductive connector 112 and the engaging concave portion 1221 of the connecting plug 122 enables the first circuit board 11 and the second circuit board 12 to automatically align with each other, thereby ensuring that each contact is securely and accurately connected without connection errors or bad contact.

The conductive connector 112 of the first circuit board 11 is electrically connected to circuits disposed between the first surface 1111 and the second surface 1112 of the first substrate 111. The connecting plug 122 of the second circuit board 12 is also electrically connected to the circuits disposed on the first surface 1211 and the second surface 1212 of the second substrate 121. Furthermore, the connection between the conductive connector 112 of the first circuit board 11 and the connecting plug 122 of the second circuit board 12 can electrically connect the circuits disposed on the first circuit board 11 and the second circuit board 12, thereby greatly improving the multi-application of the designed antenna circuit.

In order to firmly engage the conductive connector 112 and the engaging concave portion 1221 of the connecting plug 122, an embodiment of the structure is as follows: when the first connecting end 1121 of the conductive connector 112 of the first circuit board 11 is not engaged in the engaging concave portion 1221 of the connecting plug 122 of the second circuit board 12, the inner diameter of the engaging concave portion 1221 along the radial direction of the connecting plug 122 is smaller than the outer diameter of the first connecting end 1121 of the conductive connector 112 along the radial direction of the connecting plug 112. Therefore, when the first connecting end 1121 of the conductive connector 112 is engaged in the engaging concave portion 1221 of the connecting plug 122 by pressing, the first connection end 1221 of the conductive connector 112 of the first circuit board 11 is deformed and engaged in the engaging concave portion 1221 of the connecting plug 122.

Referring to FIG. 1 and FIG. 2, a first embodiment of the present invention further comprises a third circuit board 13. The third circuit board 13 is disposed on the second surface 1112 of the first substrate 111 and includes a third substrate 131 and a connecting plug 132. The third substrate 131 has a first surface 1311 and a second surface 1312 opposite to each other. The first surface 1311 is disposed toward the second surface 1112 of the first substrate 111. The third substrate 131 is formed with a through hole. The through hole is disposed from the first surface 1311 of the third substrate 131 to the second surface 1312 of the third substrate 131 and corresponds to the conductive connector 112 of the first substrate 111. One end of the connecting plug 132, facing the first surface 1311 of the third substrate 131, is formed with an engaging concave portion 1321. The engaging concave portion 1321 is engaged with the corresponding first connecting end 1121 of the conductive connector 112 of the first substrate 111.

The first connecting end 1121 of the conductive connector 112 disposed on the first circuit board 11 and the engaging concave portions 1221,1321 of the connecting plugs 122, 132 not only correspond to each other but also can be engaged with each other. Therefore, in the process of connecting the first circuit board 11 and the second circuit board 12, when the second circuit board 12 and the third circuit board 13 each reach a respective connection position with the first circuit board 11, the first connecting end 1121 and the second connecting end 1122 of the conductive connector 112 can be slightly dropped in the engaging concave portions 1221,1321 of the second circuit board 12 and the third circuit board 13. By further performing a pressing step, the first connecting end 1121 and the second connecting end 1122 are deformed to be closely fixed to the engaging concave portions 1221,1321. Therefore, the first circuit board 11 can be connected with the second circuit board 12 and the third circuit board 13 is formed as a multilayer circuit board module through a fast and accurate way.

Further, the circuit layers of the first circuit board 11, the second circuit board 12 and the third circuit board 13 can be combined to form an antenna module through the design of the circuit board. For example, antenna units with different widths, thicknesses or materials may be formed on the second circuit board 12 and the third circuit board 13 according to requirements, so as to receive wireless communication signals of different frequency bands. The antenna units are electrically connected to each other through the conductive connector 112 of the first circuit board 11 to form a complete wireless communication module, thereby increasing the flexibility and multi-application of the antenna design.

Figure 3:
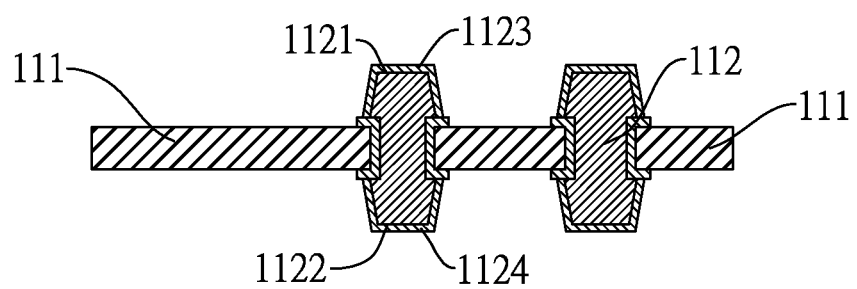
FIG. 3 is a cross-sectional view of an antenna carrier plate structure according to a second embodiment of the present invention.

Referring to FIG. 3, in a second embodiment of the present invention, the conductive connector 112 of the first circuit board 11 comprises a metal stud, for example, a copper stud with the same material as the circuit layer of the first circuit board 11. The conductive connector 112 further includes a first coating 1123 and a second coating 1124. The first coating 1123 covers the surface of the first connecting end 1121 of the conductive connector 112 and the second coating 1124 covers the surface of the second connecting end 1122. The first coating 1123 and the second coating 1124 are flexible metal layers, for example, a gold layer or a nickel layer. During the pressing process of the connecting plug 122 of the second circuit board 12 and the conductive connector 112 of the first circuit board 11, the first coating 1123 and the second coating 1124 are soft to be easily deformed after pressed, so that the engaging concave portions 1221, 1321 of each of the connecting plugs 122, 132 can be easily pressed and tightly joined with the first connecting end 1121 and the second connecting end 122 of the conductive connector 112.

Figure 4:
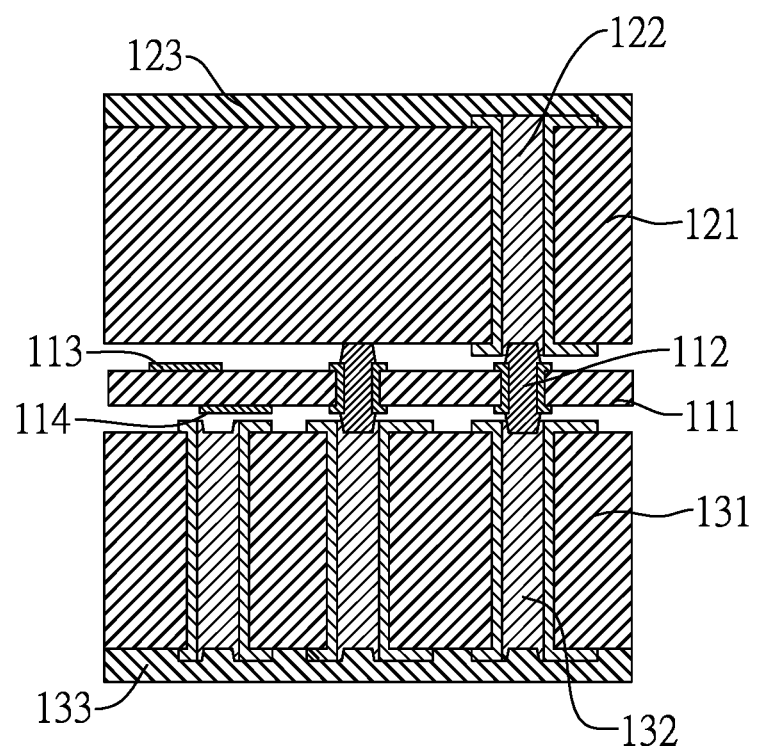
FIG. 4 is a cross-sectional view of an antenna carrier plate structure according to a third embodiment of the present invention.

Referring to FIG. 4, in a third embodiment of the present invention, the first circuit board 11 includes a first circuit layer 113 and a second circuit layer 114. The second circuit board 12 further includes a first antenna layer 123. The first antenna layer 123 is disposed on the second surface 1212 of the second substrate 121 to form a first antenna unit. The first antenna unit is electrically connected to the first circuit layer 113 of the first circuit board 11 through the connecting plug 122 of the second circuit board 12 and the conductive connector 112 of the first circuit board 11.

Similarly, the third circuit board 13 further includes a second antenna layer 133. The second antenna layer 133 is manufactured on the second surface 1312 of the third substrate 131 to form a second antenna unit. The second antenna unit is electrically connected to the second circuit layer 114 of the first circuit board 11 through the connecting plug 132 of the third circuit board 13 and the conductive connector 112 of the first circuit board 11.

The first antenna layer 123 and the second antenna layer 133 each form a respective antenna unit. The antenna units are arranged on the outer sides of the second circuit board 12 and the third circuit board 13, namely the second surface 1212 of the second substrate 121 and the second surface 1312 of the third substrate 131, to receive wireless signals In the antenna carrier structure of the present invention, the circuit carrier plates are manufactured and interconnected by pressing. When further connecting to electrical circuit chips, any of the substrates of the present invention can be electrically connected to electrical circuit chips by forming through holes on the adjacent circuit boards.

Figure 5:
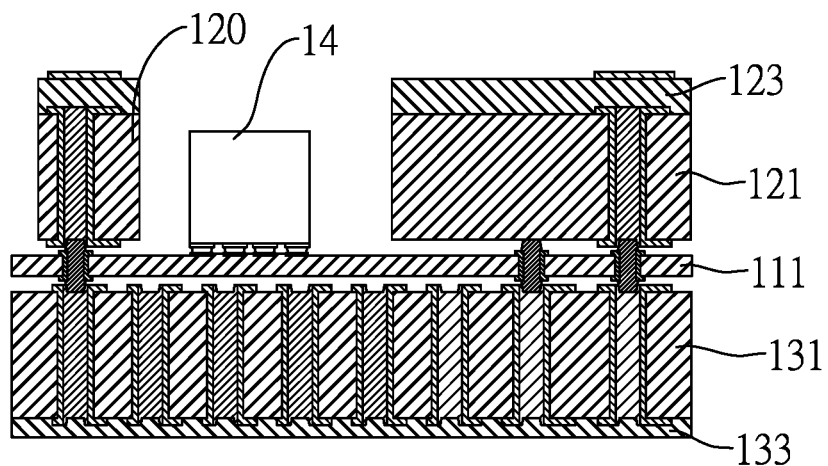
FIG. 5 is a cross-sectional view of an antenna carrier plate structure according to a fourth embodiment of the present invention.
Figure 6:
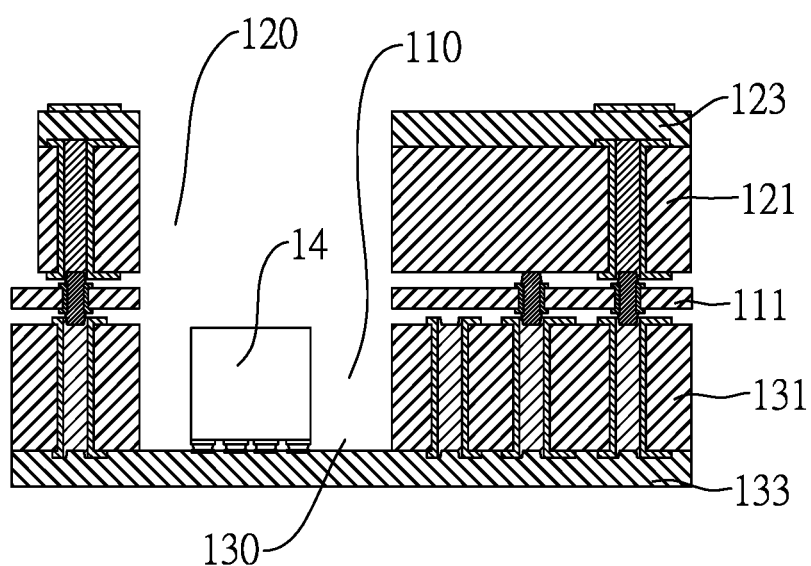
FIG. 6 is a cross-sectional view of an antenna carrier plate structure according to a fifth embodiment of the present invention.

For example, as shown in FIG. 5, in a fourth embodiment of the present invention, a processing chip 14 is further included. The second substrate 121 is formed with a chip hole 120. The processing chip 14 is disposed in the chip hole 120 and is disposed on the first surface 1111 of the first substrate 11 to electrically connect the first circuit layer 113 of the first substrate 111. As shown in FIG. 6, in a fifth embodiment of the present invention, the second substrate 121, the first substrate 111 and the third substrate 131 are each formed with a respective chip hole 120, 110, 130. The chip holes 120, 110, 130 of the second substrate 121, the first substrate 111 and the third substrate 131 are correspondingly disposed and communicate with each other. The processing chip 14 is arranged in the chip holes 120, 110, 130 of the second substrate 121, the first substrate 111, and the third substrate 131 and is electrically connected with the second antenna layer 133 of the second antenna unit.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An antenna carrier plate structure comprising:
   a first circuit board including:
      a first substrate having a first surface and a second surface opposite to each other; and
      a conductive connector having a first connecting end and a second connecting end and disposed through the first substrate, wherein the first connecting end protrudes from the first surface and the second connecting end protrudes from the second surface;
      the conductive connector including:
         a first coating covering a surface of the first connecting end of the conductive connector; and
         a second coating covering a surface of the second connecting end of the conductive connector;
   a second circuit board including:
      a second substrate having a first surface and a second surface opposite to each other, wherein the first surface of the second substrate faces the first surface of the first substrate, and the second substrate is formed with a through hole that is disposed from the first surface of the second substrate to the second surface of the second substrate; and
      a connecting plug arranged in the through hole of the second substrate, wherein the connecting plug is formed with an engaging concave portion at an end facing the first surface of the first substrate, while the engaging concave portion corresponds to the first connecting end of the conductive connector and is engaged with the first connecting end of the conductive connector when pressed against one another;
   when the first connecting end of the conductive connector of the first circuit board is not yet engaged with the engaging concave portion of the connecting plug of the second circuit board, an inner diameter of the engaging concave portion of the connecting plug of the second circuit board along a radial direction of the connecting plug is smaller than an outer diameter of the first connecting end of the conductive connector of the first circuit board along the radial direction of the connecting plug;
   when the first connecting end of the conductive connector of the first circuit board engages in the engaging concave portion of the connecting plug of the second circuit board by pressing, the first coating and the first connection end of the conductive connector of the first circuit board are deformed to engage in the engaging concave portion of the connecting plug of the second circuit board.

2. The antenna carrier plate structure as claimed in claim 1, wherein the first coating and the second coating of the conductive connector are nickel layers or gold layers.

3. The antenna carrier plate structure as claimed in claim 1, wherein
   the first substrate of the first circuit board is formed with a first circuit layer that is electrically connected to the conductive connector;
   the second circuit board further includes a first antenna layer provided on the second surface of the second substrate and the first antenna layer forms a first antenna unit; wherein the first antenna unit is electrically connected to the first circuit layer of the first circuit board through the connecting plug of the second circuit board and the conductive connector of the first circuit board;

the antenna carrier plate structure further comprises a processing chip, wherein the second substrate is formed with a chip hole;

the processing chip is mounted in the chip hole of the second substrate and on the first surface of the first substrate to electrically connect the first circuit layer of the first substrate.

4. The antenna carrier plate structure as claimed in claim 1, further comprising:

a third circuit board including:

a third substrate having a first surface and a second surface opposite to each other, wherein the first surface of the third substrate faces the second surface of the first substrate, and the third substrate is formed with a through hole that is disposed from the first surface of the third substrate to the second surface of the third substrate; and a connecting plug arranged in the through hole of the third substrate, wherein the connecting plug of the third circuit board is formed with an engaging concave portion that is engaged with the second connecting end of the conductive connector, and the second coating is deformed to engage in the engaging concave portion of the connecting plug of the third circuit board;

wherein:

the first substrate of the first circuit board is further formed with a second circuit layer that is electrically connected to the conductive connector;

the third circuit board further includes a second antenna layer provided on the second surface of the third substrate and the second antenna layer forms a second antenna unit; wherein the second antenna unit is electrically connected to the second circuit layer of the first circuit board through the connecting plug of the third circuit board and the conductive connector of the first circuit board;

the antenna carrier plate structure further comprises:

a processing chip, wherein the second substrate, the first substrate and the third substrate are each formed with a respective chip hole; the chip hole of the second substrate, the chip hole of the first substrate, and the chip hole of the third substrate are connected to form a channel through the second substrate, the first substrate and the third substrate;

the processing chip is mounted in the channel, and is electrically connected to the second antenna layer of the second surface of the third substrate.

5. An antenna carrier plate structure comprising:

a first circuit board including:

a first substrate having a first surface and a second surface opposite to each other; and a conductive connector having a first connecting end and a second connecting end and disposed through the first substrate, wherein the first connecting end protrudes from the first surface and the second connecting end protrudes from the second surface;

a second circuit board including:

a second substrate having a first surface and a second surface opposite to each other, wherein the first surface of the second substrate faces the first surface of the first substrate, and the second substrate is formed with a through hole that is disposed from the first surface of the second substrate to the second surface of the second substrate; and a connecting plug arranged in the through hole of the second substrate, wherein the connecting plug is formed with an engaging concave portion at an end facing the first surface of the first substrate, while the engaging concave portion corresponds to the first connecting end of the conductive connector and is engaged with the first connecting end of the conductive connector when pressed against one another;

the first substrate of the first circuit board is formed with a first circuit layer that is electrically connected to the conductive connector;

the second circuit board further includes a first antenna layer provided on the second surface of the second substrate and the first antenna layer forms a first antenna unit; wherein the first antenna unit is electrically connected to the first circuit layer of the first circuit board through the connecting plug of the second circuit board and the conductive connector of the first circuit board;

the first substrate is thinner than the second substrate.

6. The antenna carrier plate structure as claimed in claim 5, further comprising:

a processing chip, wherein the second substrate is formed with a chip hole;

the processing chip is mounted in the chip hole of the second substrate and on the first surface of the first substrate to electrically connect the first circuit layer of the first substrate.

7. The antenna carrier plate structure as claimed in claim 5, further comprising:

a third circuit board including:

a third substrate having a first surface and a second surface opposite to each other, wherein the first surface of the third substrate faces the second surface of the first substrate, and the third substrate is formed with a through hole that is disposed from the first surface of the third substrate to the second surface of the third substrate;

a connecting plug arranged in the through hole of the third substrate, wherein one end of the connecting plug of the third circuit board is formed with an engaging concave portion that is engaged with the second connecting end of the conductive connector of the first substrate.

8. The antenna carrier plate structure as claimed in claim 7, wherein the first substrate of the first circuit board is further formed with a second circuit layer that is electrically connected to the conductive connector; and the third circuit board further includes a second antenna layer provided on the second surface of the third substrate and the second antenna layer forms a second antenna unit; wherein the second antenna unit is electrically connected to the second circuit layer of the first circuit board through the connecting plug of the third circuit board and the conductive connector of the first circuit board.

9. The antenna carrier plate structure as claimed in claim 8, wherein the widths, the thicknesses or the material of the first antenna unit and the second antenna unit are different.

10. The antenna carrier plate structure as claimed in claim 7, further comprising:

a processing chip, wherein the second substrate, the first substrate and the third substrate are each formed with a respective chip hole; the chip hole of the second substrate connects to the chip hole of the first substrate, the chip hole of the first substrate connects to the chip hole of the third substrate, and all the chip holes are connected to form a channel through the second substrate, the first substrate and the third substrate;

the processing chip is mounted in the channel formed by the chip holes of the second substrate, the first substrate and the third substrate, and is electrically connected to the second antenna layer of the second surface of the third substrate.

* * * * *